US 6,691,855 B1

(12) United States Patent
Takahashi et al.

(10) Patent No.: US 6,691,855 B1
(45) Date of Patent: Feb. 17, 2004

(54) APPARATUS AND METHOD FOR ALIGNING PARTS

(75) Inventors: Shigeki Takahashi, Omihachiman (JP); Nihei Kaishita, Omihachiman (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 466 days.

(21) Appl. No.: 09/097,013

(22) Filed: Jun. 15, 1998

(30) Foreign Application Priority Data

Jun. 19, 1997 (JP) .............................. 9-180348
May 18, 1998 (JP) ........................... 10-134970

(51) Int. Cl.⁷ ............................................ B65G 47/14
(52) U.S. Cl. ...................................................... 198/396
(58) Field of Search ................................ 198/392, 396, 198/443; 221/162, 168

(56) References Cited

U.S. PATENT DOCUMENTS

| | | | |
|---|---|---|---|
| 1,600,715 A | * 9/1926 | Cameron | 198/396 |
| 1,799,342 A | 4/1931 | Wilcox | |
| 2,078,659 A | * 4/1937 | Gualtiere | 221/168 |
| 4,057,137 A | * 11/1977 | Hansen et al. | 198/443 |
| 4,079,831 A | 3/1978 | Greider | |
| 4,238,023 A | 12/1980 | Millar et al. | |
| 6,019,212 A | * 2/2000 | Takahashi et al. | 198/392 |
| 6,112,937 A | * 9/2000 | Takahashi et al. | 198/392 |
| 6,161,676 A | * 12/2000 | Takahashi et al. | 198/392 |

FOREIGN PATENT DOCUMENTS

| | | |
|---|---|---|
| EP | 0 597 419 A1 | 5/1994 |
| JP | 593665 | 12/1925 |
| JP | 44-7997 | 4/1969 |
| JP | 60-81925 | 6/1985 |
| JP | 8-143164 | 6/1996 |

* cited by examiner

Primary Examiner—Joseph E. Valenza
(74) Attorney, Agent, or Firm—Burns, Doane, Swecker & Mathis, LLP

(57) ABSTRACT

There is disclosed a part-aligning apparatus that is simple in structure, less damages chip parts, and operates well even if its chip discharge passage is clogged or overflows. The apparatus has a part-holding chamber for accommodating a number of chip parts. An arc-shaped chute groove is formed in the inner surface of the bottom of the part-holding chamber to orient the chip parts in a given direction and to guide the sliding chips. A gate port is formed at the lower end of the chute groove to pass the sliding chip parts one by one. The discharge passage is formed tangent to the chute groove to align the passed chip parts in a row and to deliver them. Claw portions for removing clogging are formed on the inner surface of a rotary drum that forms the part-holding chamber. The claw portions urge any chip part halted in the gate port in an abnormal posture toward an opposite direction different from the direction in which the chips are delivered.

11 Claims, 9 Drawing Sheets

APPARATUS AND METHOD FOR ALIGNING PARTS

BACKGROUND OF THE INVENTION

The present invention relates to an apparatus and method for aligning a multiplicity of chip parts in a row and delivering them.

Known part-aligning apparatus of this kind include bulk feeders and vibrating ball feeders. Bulk feeders are roughly classified into pneumatically driven bridge breaking type and bridge breaking type using an upwardly thrust pin. With the pneumatically driven type, it is difficult to adjust the amount and direction of airflow. With the upwardly thrust pin type, whenever an operation is performed, the pin impacts the parts and so the parts tend to be easily scratched or damaged. In either type, every chip part is forced toward a funnellike exit. Therefore, if a bridge breaking operation is once performed, the bridge is immediately restored. In consequence, the efficiency at which parts are aligned is low. In the case of the vibrating ball type, any bridge is not readily formed. However, the equipment is expensive. Vibration is easily transmitted to other apparatus. Furthermore, large space is necessitated.

A part-aligning apparatus free of these problems is proposed in Japanese Unexamined Patent Publication No. 143164/1996, and comprises a cylindrical stocker for holding chip parts, an annular body disposed on the outer surface of the outer curved wall of the stocker, and a rotary disk having an annular indexing portion. This indexing portion is rotatably disposed in the gap between the outer curved wall of the stocker and the inner surface of the annular body. The indexing portion has a plurality of chip-holding recesses for seizing the chip parts individually. A chip discharge hole in communication with a chip storage portion is formed near the bottom of the outer wall of the stocker and in the path over which the chip-holding recesses are moved. In this case, movement is provided only by rotary motion and so it is easy to make an adjustment. The chip parts are less damaged. In addition, the apparatus can be easily built in smaller size.

The above-described part-aligning apparatus requires at least the stocker, the annular body, and the rotary disk. Therefore, this apparatus is complex in structure and often breaks down. It is necessary that the rotary disk be provided with chip-holding recesses arranged circumferentially, the recesses conforming to the shapes of the individual chip parts. In order to align micrometer chip parts as long as about 1 mm long, the chip-holding recesses must be processed in correspondingly small size. Hence, the apparatus is very complex in structure and laborious to machine, thus increasing the cost.

The chip parts are held one by one by the chip-holding recesses in the indexing portion of the rotary disk. As the disk turns, the chip parts are forced toward a chute. Therefore, if the chute becomes clogged or overflows for some reason, a chip part subsequently fed in will be caught in the chute. As a result, the chip part may be damaged or the apparatus itself may break down. At this time, therefore, it is necessary to quickly stop the rotary disk using a full occupation sensor.

SUMMARY OF THE INVENTION

It is an object of the present invention to provide a part-aligning apparatus that is simple in structure, less damages chip parts to be aligned, and functions well even if the chip discharge passage becomes clogged or overflows.

It is another object of the invention to provide a method of aligning chip parts without being affected by clogging of the chip discharge passage or by overflow of the chute such that the chip parts are less damaged than heretofore.

The above objects are achieved in accordance with the teachings of the invention by an apparatus comprising: a part-holding chamber for accommodating a multiplicity of chip parts; a chute groove formed at least in the inner surface of the bottom of the part-holding chamber and acting to orient the chip parts in a given direction and to cause them to slide downward; a gate port for passing the chip parts one by one, the chip parts sliding downward in a given posture along the chute groove; a discharge passage for aligning the chip parts passed through the gate port in a row and delivering the parts; and a rotary impeller having blades rotatably held in the part-holding chamber. The blade shave front end portions passing over the gate port. The blades of the impeller are rotated to urge any chip part halted in an abnormal posture in the gate port toward a direction different from a direction in which the chip parts are delivered, thus removing the clogging.

The chip part introduced into the part-holding chamber is kept on the inner surface of the bottom by gravity and falls into the chute groove. Since the chute groove is formed at a desired width, the chip part falls into the chute groove and oriented in a given direction. For example, where the chip part assumes a boxlike shape, i.e., the length is greater than the width and the height, if the width of the chute groove is set smaller than the width and the height of the chip parts, the chute groove can align the chip parts in the vertical direction. Each chute part falling into the chute groove is slid downward by gravity and brought into the gate port. If the chute part is in a correct posture (e.g., a lateral posture), the chip part passes through the gate port intact. Then, it is discharged into a discharge passage. However, if a chip part in an abnormal posture (e.g., an elevated posture) reaches the gate port, the part clogs the port. Since the blades of the rotary impeller pass over the gate port regularly, the chip part staying in the gate port is urged toward a direction different from the direction in which chip parts are discharged. The result is that the chip part is removed from the gate port or modified into normal posture. This removes the clogging. Hence, the following chip parts are allowed to be discharged from the gate port.

When a guide surface for sliding chip parts into the chute groove is provided on an inner surface of the part-holding chamber, aligning efficiency is improved, because the chip parts slide into the chute groove smoothly. A guide surface may have curved surface rather than inclined surface, as long as the guide surface can slide the chip parts into the chute groove smoothly.

Various means are conceivable as means for removing clogging. For example, where means for removing clogging are claw portions which are provided with a rotary member rotating around a horizontal axis and which rotate just above the gate port in an opposite direction to the chip parts discharging direction, clogging will be removed, because the claw portions apply power to chip parts in the opposite direction of chip parts discharging direction. Note that shapes or numbers of claw portions are not limited.

The clogging-removing means can be other than the rotary member. For instance, an air ejection nozzle or a thrust pin may be mounted near the gate port. The pin is periodically ejected or thrust to remove the clogging. The direction in which the air is ejected or the pin is thrust is not always required to be opposite to the direction in which chip parts are discharged. The former direction may be at right angles to the discharge direction.

When the rotary member is used as a clogging-removing means, clogging-removing efficiency in improved, because the chip parts which are clogged at the gate port can be easily fallen down by rotating the rotary member intermittently.

When the part-holding chamber is a cylinder-like space whose central axis is a horizontal axis, preferably, a chute groove is formed as an arc-shaped groove on an inner surface of the cylinder-like space, and claw portions of the rotary member as a clogging-removing means rotate along the groove.

In such a case, the claw portions have the following functions besides the clogging-removing function of the chip parts:
  a function for dissolving the bridges of chip parts which are not slid down into the chute groove by stirring the chip parts in the part-holding chamber.
  a function for forwarding all of the chip parts to the chute groove when the number of chip parts in the part-holding chamber becomes small., etc.

When a part-holding chamber comprises a fixed drum and a rotary drum, and a chute groove is an arc-shaped drum formed on an inner peripheral surface of the fixed drum, it would be preferable that a clogging-removing means is a claw portion provided on an inner surface of the rotary drum. In such a case, since the rotary drum which constructs the side wall of the part-holding chamber functions as a clogging-removing means also, the construction can be more simplified.

Further, instead of the rotary drum, rotary wings can be provided inside the part-holding chamber, clogging at the gate port can be removed by those wings.

When a chute groove is arc-shaped, it is preferable to form the discharging passage substantially in the tangent direction of the arc-shaped chute groove, and to provide the gate port at the contact point between the chute groove and the discharging passage, because the movement of the chip parts from the chute groove toward the discharging passage is smooth. It is not limited to that the discharging passage is formed in the tangent direction precisely to the chute groove, it may be rather inclined to.

In another embodiment of the invention, plural chute grooves are formed in parallel in the inner surface of the part-holding chamber, and the gate port and are formed at the lower end of each chute groove. And a plurality of discharge passages for supplying chip parts discharged from each gate port in a single line are formed. In this case, chip parts are aligned with improved efficiency.

The present invention is adapted for alignment of chip parts in a boxlike form, i.e., the length is greater than the vertical and lateral dimensions. The invention can be applied to alignment and delivery of cubic chip parts and cylindrical chip parts as well as to boxlike chip parts.

Other objects and features of the invention will appear in the course of the description thereof, which follows.

DESCRIPTION OF THE PREFERRED EMBODIMENTS

Figure 1:
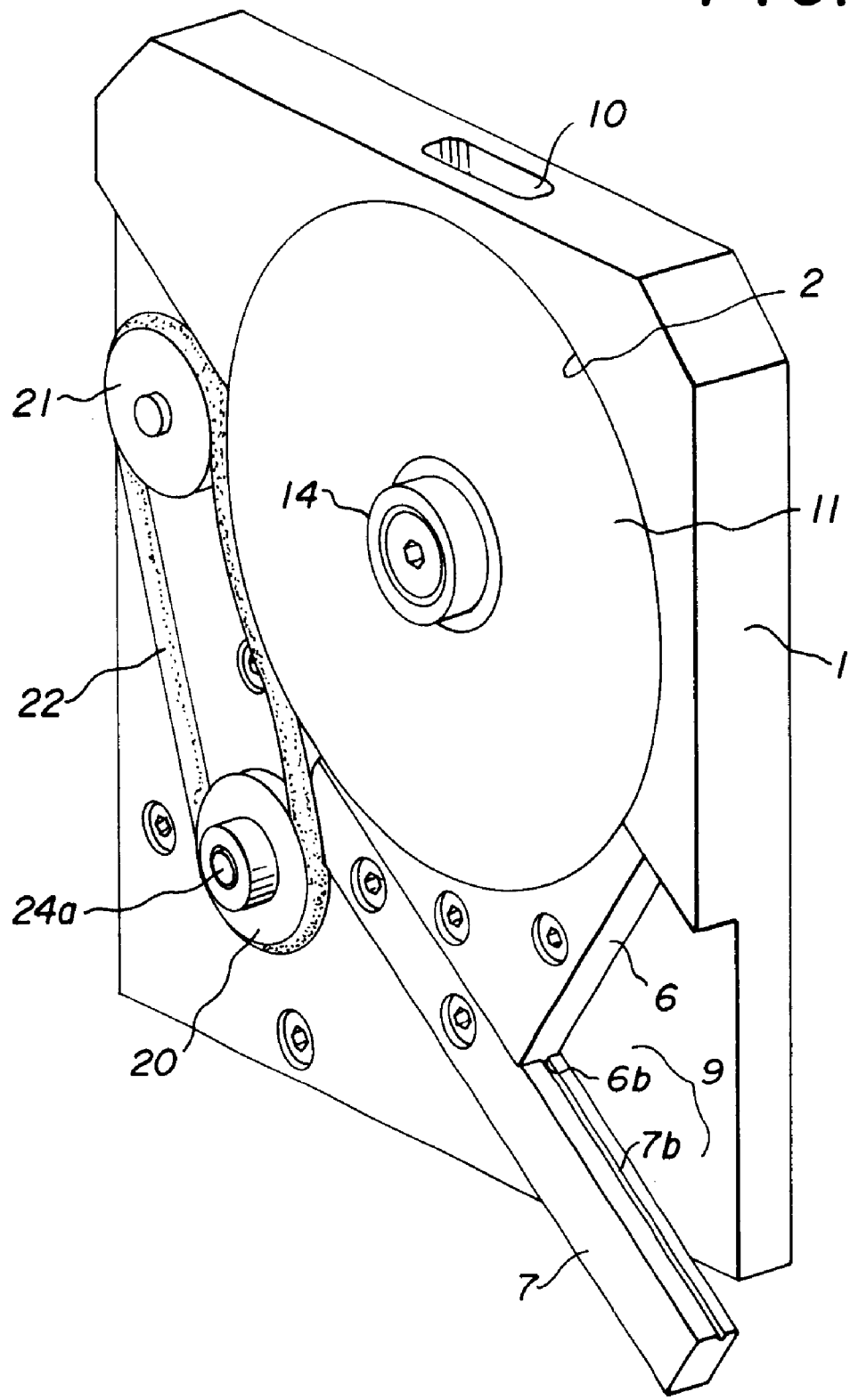
FIG. 1 is a perspective view of a part-aligning apparatus in accordance with the present invention.
Figure 2:
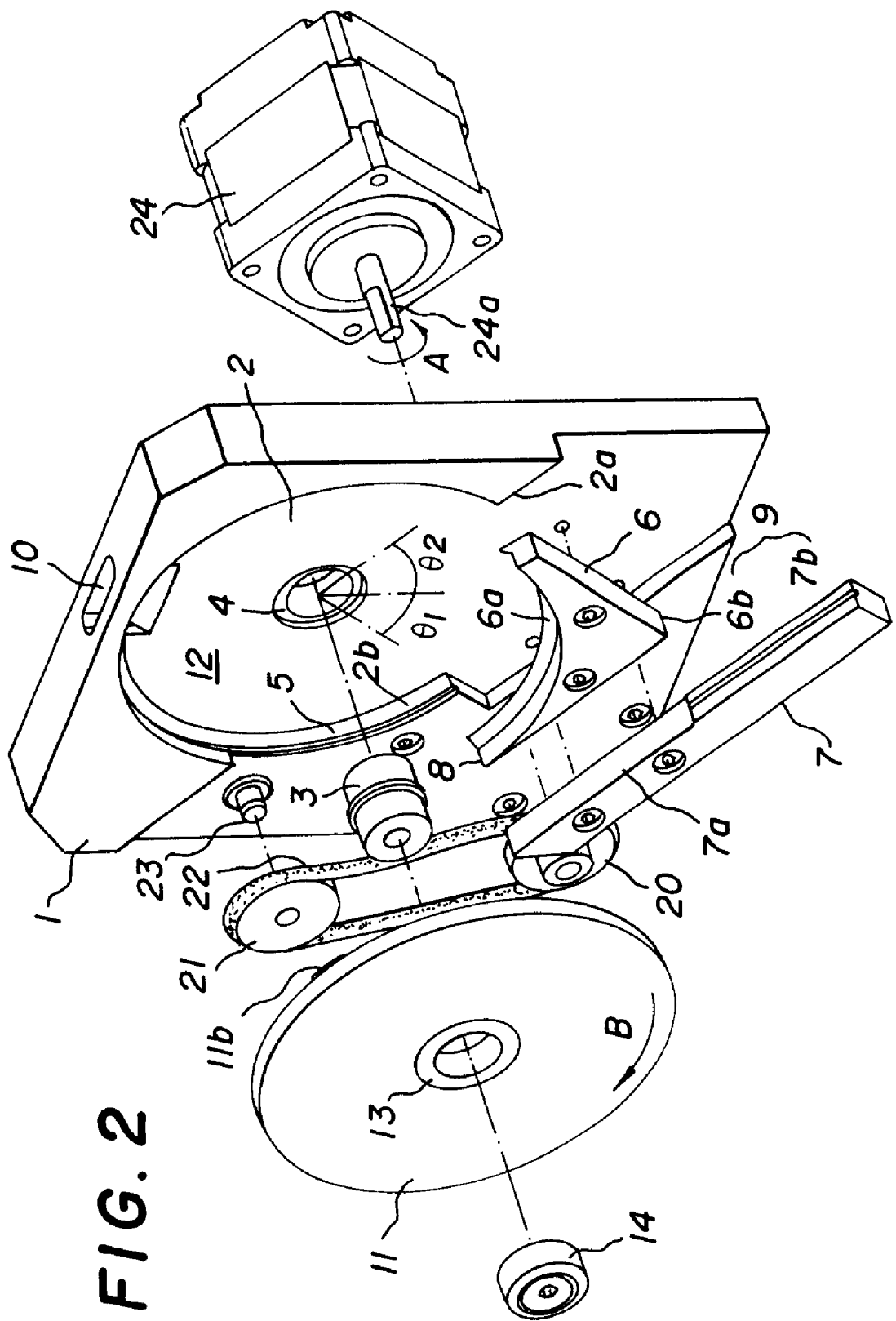
FIG. 2 is an exploded perspective view of the part-aligning apparatus shown in FIG. 1.
Figure 3:
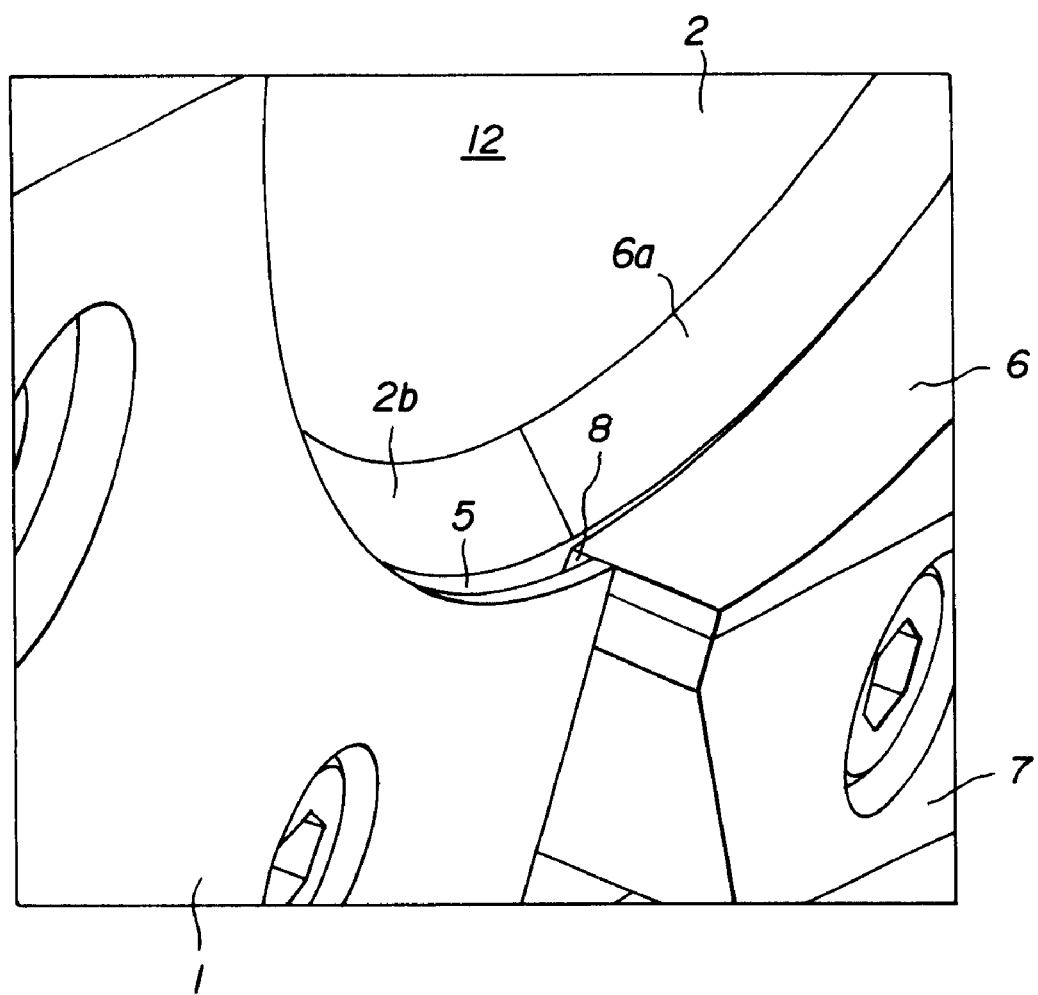
FIG. 3 is an enlarged perspective view of the gate port of the part-aligning apparatus shown in FIG. 1.
Figure 4:
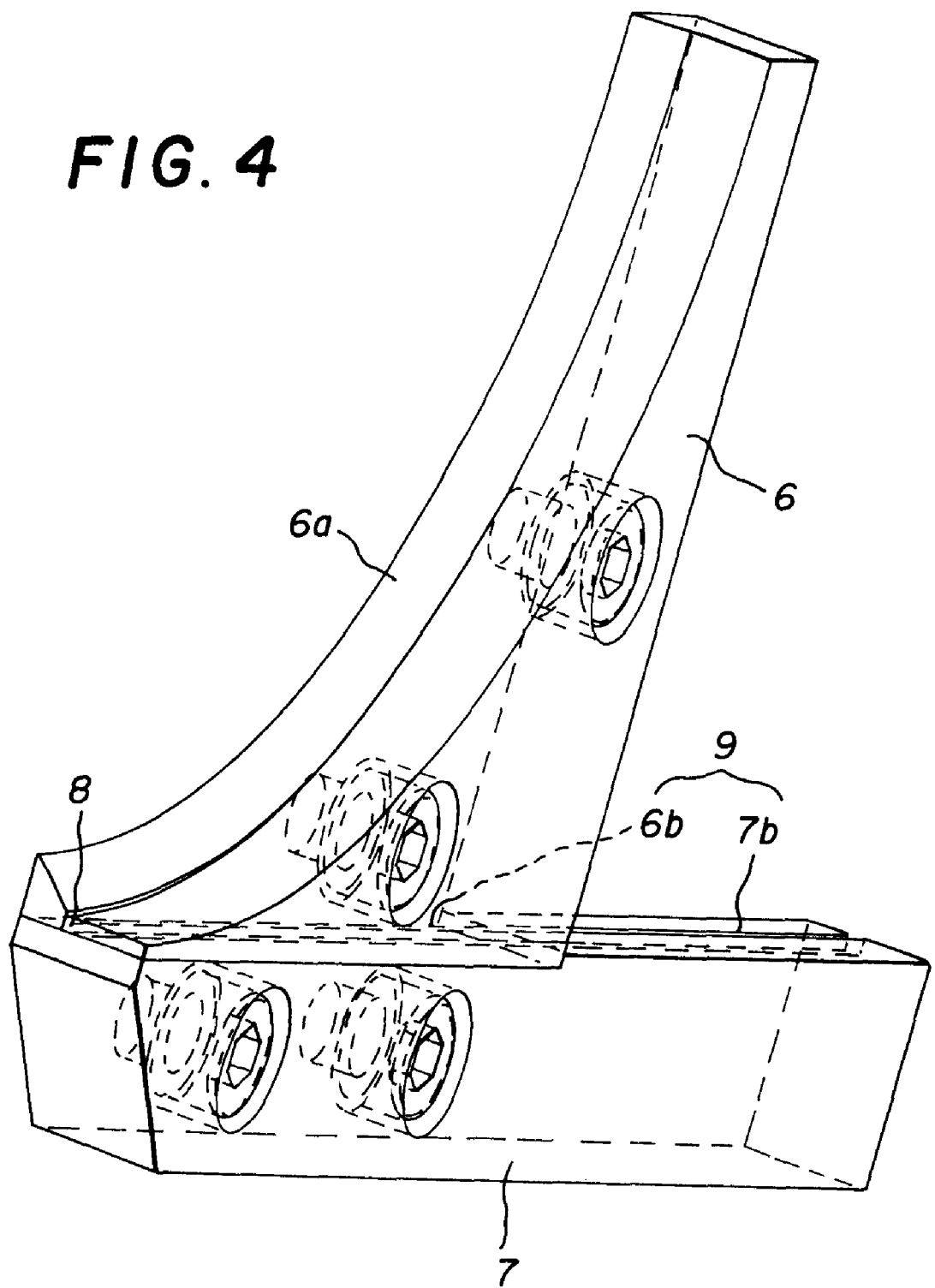
FIG. 4 is an enlarged perspective view of first and second blocks of the apparatus shown in FIGS. 1–3.

A part-aligning apparatus in accordance with the present invention is shown in FIGS. 1–7. This apparatus aligns chip parts one example of which is shown in FIG. 8, where a chip part C assumes a boxlike form and has a height of H, a width of W, and a length of L (H≅W, L>H, and L>W). Electrodes Ca and Cb are formed at longitudinal ends, respectively, of the chip part C.

A stationary drum 1 is made of a hard plate and provided with a substantially circular recess 2 in its surface. A holding hole 4 in which a rotating shaft 3 is fitted and held is formed in the center of the recess 2. A nearly arc-shaped chute groove 5 is formed in the inner surface of the recess 2 such that its width is equal to the sum of the width W of the chip part C and a given clearance and that its depth is equal to the sum of the height H of the chip part C and a certain clearance. The recess 2 extends angle $\theta_1$ in a clockwise direction about a plumb line extending downward and angle $\theta_2$ in a counterclockwise direction, forming a cutout 2a. A first block 6 is screwed or otherwise fixed to this cutout 2a. A continuous arc-shaped surface is formed across both recess 2 and block 6. Tapered guide surfaces 2b and 6a are formed in the sectional direction of the chute groove 5 in the inner surface of the recess 2 and in the inner surface of the block 6, respectively. Especially, the guide surface 2b formed in the inner surface of the recess 2 is tilted toward the chute groove 5 and acts to guide the chip part C toward the chute groove 5. Note that the shape of the guide surface 2b is not limited to tapered one, as long as the guide surface 2b can slide the chip part C into the chute groove 5.

A second block 7 is fixed in the cutout 2a of the recess adjacently to the bottom surface of the first block 6. A first groove 6b is formed in the bottom surface of the first block 6. A flat surface 7a closing off the bottom surface of the first block 6 and a second groove 7b continuous with the first groove 6b are formed in the top surface of the second block 7. The first block 6 and the second block 7 are fixed to the stationary drum 1, forming a gate port 8 and a discharge passage 9 that are placed in communication with the chute groove 5 through two grooves 6b and 7b, respectively. The discharge passage 9 is tangent to the arc-shaped chute groove 5 and tilted downward at a given slide angle α (=$\theta_1$). Preferably, this slide angle α is set within a range given by 30°≤α<90°. The gate port 8 is formed at the junction of the arc-shaped chute groove 5 and the tangential discharge passage 9. The gate port 8 is large enough so that the chip parts C supplied in the longitudinal direction can pass one by one. That is, the height and the width of the gate port are slightly larger than H and W, respectively, and less than L. The gate port 8 is identical in width to the chute groove 5. A part introduction port 10 in communication with the recess 2 is formed in the top surface of the stationary drum 1.

Figure 5:
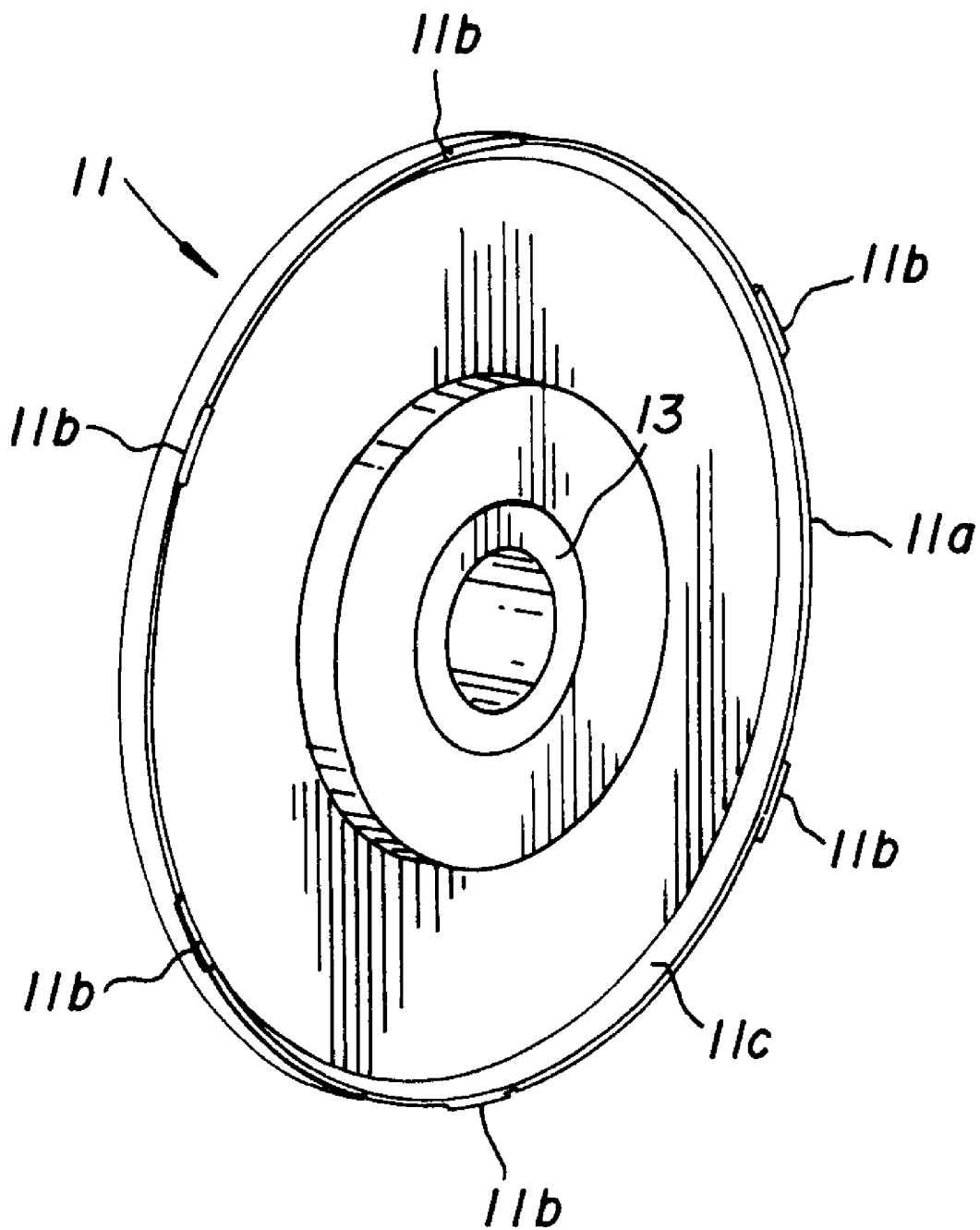
FIG. 5 is a perspective view of a rotary drum included in the apparatus shown in FIGS. 1–4, as viewed from inside.

The recess 2 in the stationary drum 1 is closed by the rotary drum 11. This rotary drum 11 is rotatably mounted to the stationary drum 1 by fitting a bearing 13 in the center of the rotary drum 11 over the rotating shaft 3. A screw 14 is used to mount the rotary drum 11 to the rotating shaft 3. A part-holding chamber 12 for accommodating a number of chip parts C is formed between both drums 1 and 11. The chip parts C introduced from the part introduction port 10 are received in this chamber. Preferably, the rotary drum 11 is made of a transparent material such as acrylic resin to permit visual check of the quantity of the chip parts C inside it. It is also possible to form an antistatic coating on the inner surface of the rotary drum 11. Furthermore, irregularities smaller than the chip part may be formed on the inner surface of the rotary drum 11 to prevent intimate adhesion of the chip part. As shown in FIG. 5, the rotary drum 11 is composed of a cylindrical portion 11a and a plurality of claw portions 11b protruding from the front end of the cylindrical portion 11a. These claw portions 11b are regularly angularly spaced from each other. In the illustrated example, the number of the claw portions is six. The cylindrical portion 11a fits inside an arc-shaped surface formed by the recessed portion 2 and the first block 6, as shown in FIG. 5. These claw portions 11b are so dimensioned as to pass over the gate portion 8 and over the chute groove 5, and act as means for removing clogging of the gate port 8. A tapered guide surface 11c opposite to the recessed portion 2 and to the guide surfaces 2b, 6a of the first block 6 is formed in the inner surface of the cylindrical portion 11a of the rotary drum 11.

A driving pulley 20 and a follower pulley 21 are rotatably disposed around the surface of the stationary drum 1 and around the recessed portion 2. A belt 22 is wound around the pulleys 20 and 21. The follower pulley 21 is rotatable about a rotating shaft 23 protruding from the stationary drum 1. An electric motor 24 has a rotating shaft 24a disposed on the back of the stationary drum 1, and the rotating shaft 24a is connected to the axial center of the driving pulley 20. When the rotating shaft 24a of the motor 24 rotates in the direction A, the pulley 22 trained around the pulleys 20 and 21 moves while in contact with the outer surface of the cylindrical portion 11a of the rotary drum 11. Thus, the drum 11 rotates in the direction B.

The method of driving the rotary drum 11 is not limited to the above-described indirect drive method, i.e., the belt 22 is rotated while kept in contact with the outer surface of the rotary drum 11. Of course, the method may also be the direct driving method, i.e., the rotating shaft 24a of the motor 24 is connected to the axial center of the rotary drum 11 and directly drives the belt.

The operation of the part-aligning apparatus of the construction described above is next described by referring to FIGS. 6 and 7. First, the chip parts C are introduced into the part-holding chamber 12 from the part introduction port 10. The chip parts C are collected in the chute groove 5 by the guide surfaces 2b and 11c formed in the stationary drum 1 and the rotary drum 11, respectively. The width of the chute groove 5 is equal to the sum of the width W of each chip part C and the given clearance. The depth of the chute groove 5 is equal to the sum of the height H and a certain clearance. The chip parts C are oriented in a given direction by the chute groove 5. Of these parts, the parts $C_1$–$C_4$ sliding down the chute groove 5 are vertically aligned and assume a lateral posture.

Figure 6:
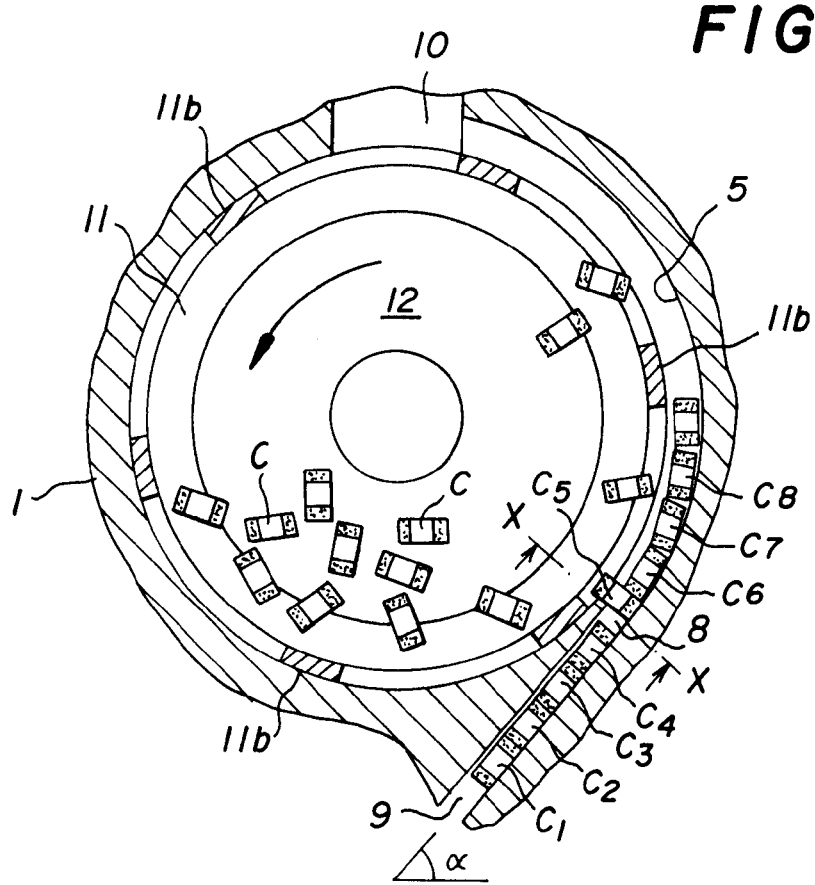
FIG. 6 is a diagram illustrating an operation for removing clogging of a part-aligning apparatus in accordance with the present invention.

Therefore, they pass through the gate port 8 without difficulty and are delivered through the discharge passage 9, as shown in FIG. 6. On the other hand, a part $C_5$ sliding downward through the chute groove 5 in an elevated posture cannot pass through the gate port 8 and thus clogs it. Consequently, the following array of parts $C_6$–$C_8$ cannot pass through the gate port 8, producing clogging.

Figure 7:
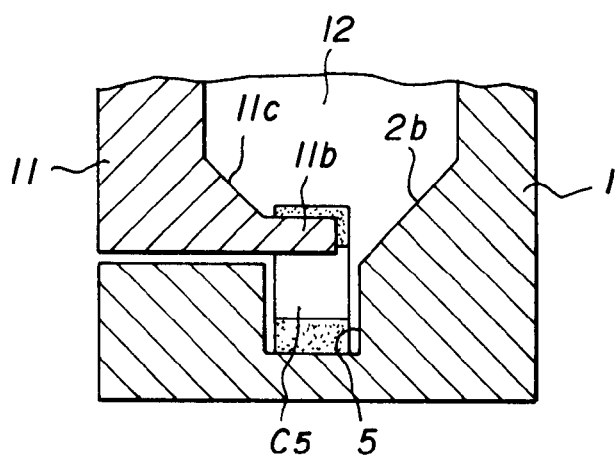
FIG. 7 is a cross-sectional view taken on line X—X of FIG. 6.
Figure 8:
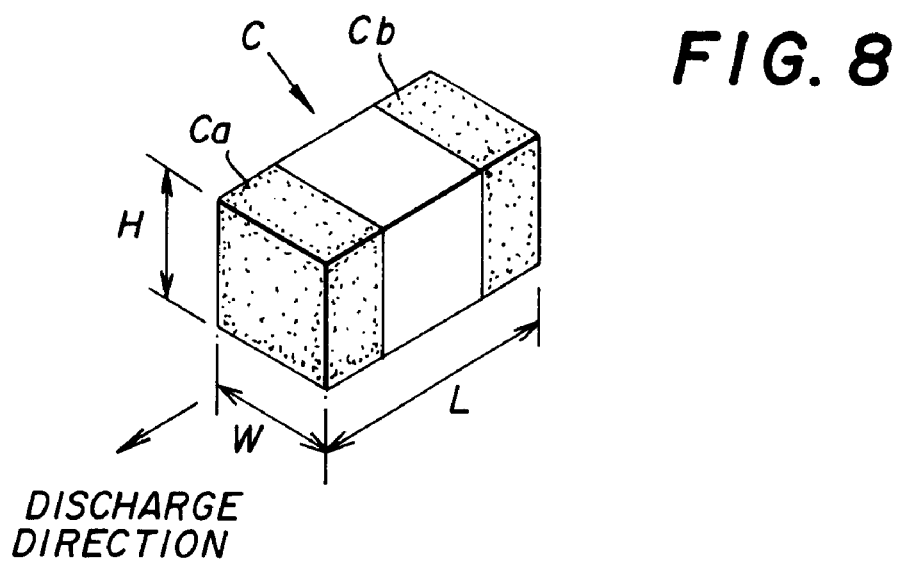
FIG. 8 is a perspective view of one example of a chip part.

Under this condition, if the rotary drum 11 rotates in the direction indicated by the arrow B, the claw portions 11b or the chip part pushed by them open the gate port 8 while throwing down the chip $C_5$ in the direction opposite to the discharge direction as shown in FIG. 7. The load imposed on the part $C_5$ is only the weight of the parts $C_6$–$C_8$ following the part $C_5$ and almost no restricting force acts on the part $C_5$ except for gravity. Therefore, the part $C_5$ can be easily removed or thrown sideways without overloading it. In consequence, the following parts $C_6$–$C_8$ including the part $C_5$ can be discharged from the gate port 8.

In the case of the prior art bulk feeder, all the selections of the height, width, and the length (H, W, L) of each chip part are made in one operation and so the alignment efficiency is low. As in the above embodiment, a selection is made about the directions of the height and the width (H, W) by the chute groove 5 formed in the stationary drum 1. A selection is made about the direction of length (L) by the gate port 8 and the claw portions 11b. Hence, the alignment efficiency is much higher than that of the prior art bulk feeder. Furthermore, the rotary drum 11 can be rotated slowly, since the rate at which the chip parts are delivered is hardly affected by the rotational speed of the rotary drum 11. In this case, the parts are less damaged. In addition, the apparatus is quiet in operation.

In addition, the claw portions 11b of the rotary drum 11 act not only to prevent clogging of the gate port 8 but also to stir those chip parts that form bridges over the guide surfaces 2b and 11c and do not easily drop into the chute groove 5. Therefore, the blades urge these chip parts to fall into the chute groove 5. If the number of chip parts remaining in the part-holding chamber 12 is made fewer, chip parts fall into the chute groove 5 at a decreased rate. However, the chip parts remaining in the part-holding chamber 12 can all be expelled, since the claw portions 11b of the rotary drum 11 force the chip parts staying on the inner surface of the first block 6 toward the chute groove 5. If a large number of chip parts are introduced in the part-holding chamber 12, their load acts on the chip parts aligned near the gate port 8, producing the possibility that movement of the chip parts is impeded. However, the claw portions 11b of the rotary drum 11 pass by the gate port 8 periodically and remove the restriction due to load. Consequently, the chip parts can pass through the gate port 8 smoothly.

In the present invention, each chip part slides down the chute groove 5 by it own weight and is not restricted, unlike in the prior art technique. Therefore, if the discharge passage 9 becomes clogged or overflows, it is unlikely that the chip part is damaged or the apparatus breaks down. In particular, if the discharge passage 9 becomes clogged or overflows, the chip part C simply stays in the chute groove 5. The part is not pushed from the rear side. The claw portions 11b of the rotary drum 11 only move in the direction opposite to the direction in which the chip part falls. Therefore, chip parts not aligned are simply pushed back upwardly. The chip parts are not overloaded. That is, if the discharge passage 9 becomes clogged or overflows, no problems take place provided that the rotary drum 11 is kept rotated.

Although the rotary drum 11 is continuously rotated in the above embodiments, the rotary drum 11 may be rotated intermittently. When the rotary drum 11 is rotated intermittently, it is preferable that not only the rotary drum 11 is stopped but also it is rotated a little in the opposite direction. In this case, a gap δ between chip parts C5 and C6 can be formed further efficiently by rotating the rotary drum 11 in the opposite direction.

When the rotary drum 11 is rotated continuously as shown in FIG. 6, a chip part C6 touches a back surface of a chip part C5 when a claw portion 11b pushes back the chip part C5 clogging at the gate port 8 to the chute groove 5. Thus, there is no gap between chip parts C5 and C6, thereby the chip part C5 would keep standing and never fall down.

Figure 9:
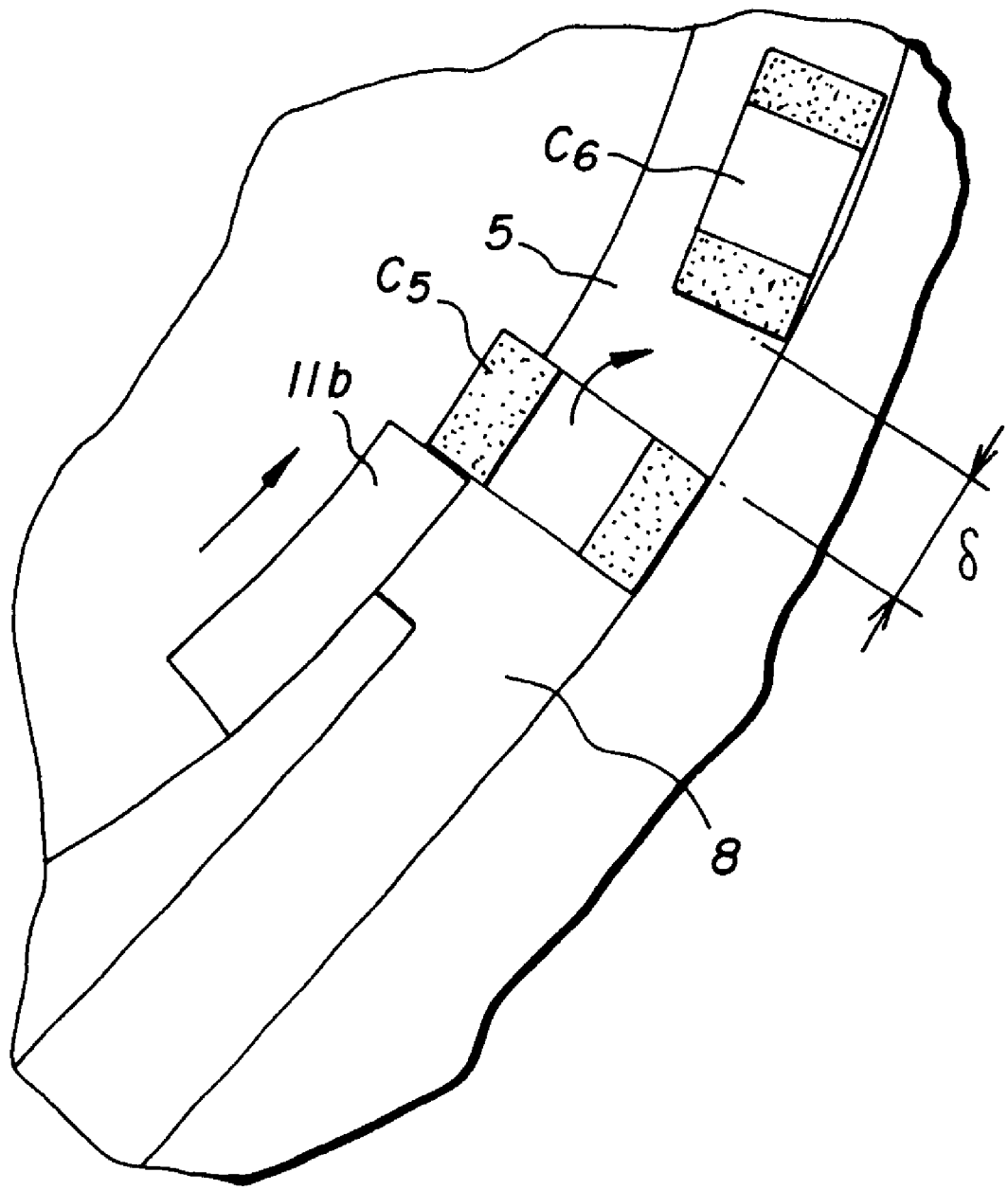
FIG. 9 is a cross-sectional view of another part-aligning apparatus in accordance with the invention.

On the other hand, when the rotary drum 11 is rotated intermittently as shown in FIG. 9, a claw portion 11b shops once when the claw portion 11b pushes back the chip part C5 clogging at the gate port 8. Therefore, a gap δ is provided between chip parts C5 and C6 by inertia. Due to this gap δ, the chip part C5 falls back and has the normal pose. Thus, the chip part C5 can pass through the gate port 8 smoothly.

Figure 10:
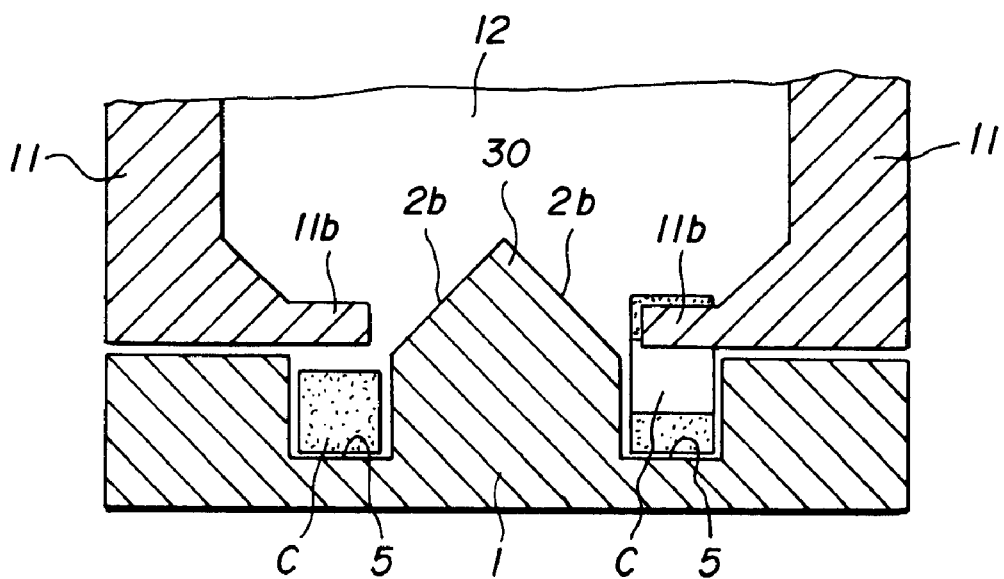
FIG. 10 is an explanatory view of operation where a rotary drum is driven intermittently.

Referring next to FIG. 10, there is shown another part-aligning apparatus in accordance with the present invention. Note that like components are indicated by like reference numerals in various figures and that those components which have been already described will not be described below.

In this embodiment, rotary drums 11 are mounted to both sides of the stationary drum 1. Two chute grooves 5 are formed in the inner surface of the stationary drum 1. This stationary drum 1 is substantially cylindrical and has ports at its front and rear sides. An annular portion 30 protruding inwardly is formed in the center. Tapered guide surfaces 2b inclined toward each chute groove 5 are formed on both side surfaces of the protruding portion 30. A gate port and a discharge passage (none of which are shown) extend continuously at the lower end of each chute groove 5. In the embodiment described above, only one part-holding chamber 12 is formed. In this embodiment shown in FIG. 9, there are two chute grooves 5. This improves the efficiency at which the chip parts C are aligned.

Figure 11:
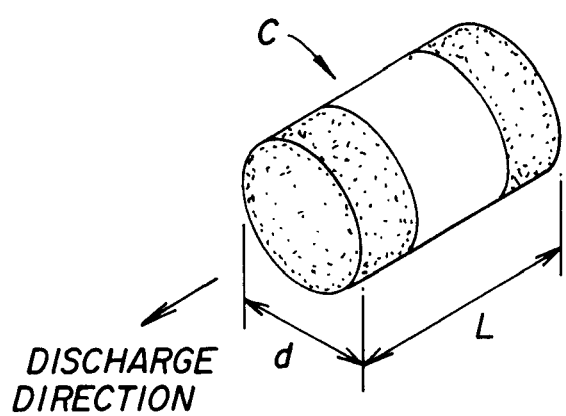
FIG. 11 is a perspective view of another example of a chip part.

In the above embodiment, the boxlike chip part C having almost identical width W and height H and a large length L is taken as an example. The aforementioned part-aligning apparatus can also align cylindrical chip parts C having a diameter d ($\simeq$W, H) and a length L (L>d) as shown in FIG. 11. The apparatus can also align cylindrical chip parts whose diameter d is equal to the length L and disklike chip parts whose diameter d is greater than the length L.

Figure 12A:
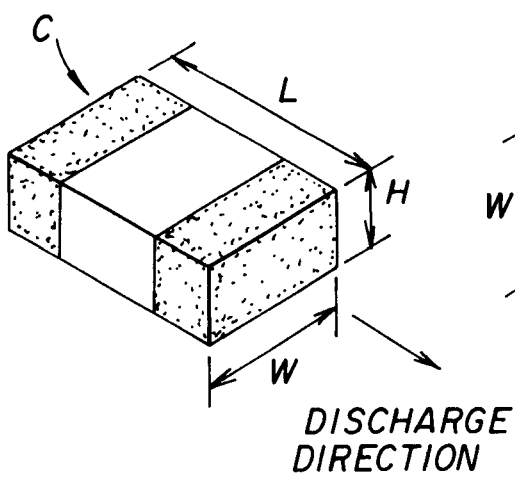
FIG. 12 is a perspective view of a further example of a chip part.
Figure 12B:
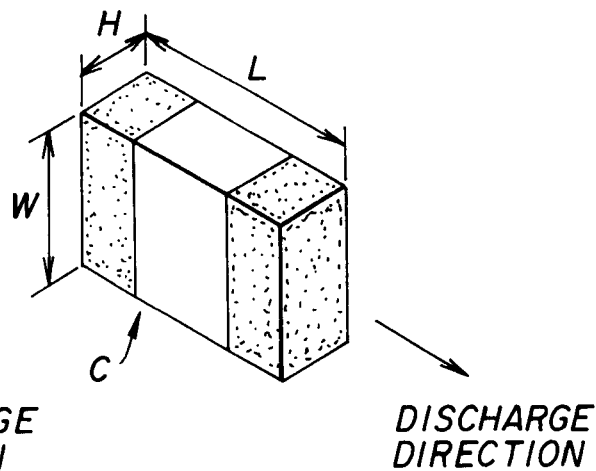

It is also possible to align boxlike chip parts C whose width W and height H are different from each other (L>W>H), as shown in FIGS. 12(A) and 12(B). The parts can be passed through the gate port 8 in a lateral posture by setting the width of the chute groove 5 greater than W and less than L and setting the height of the gate port 8 greater than H and less than W. The parts can be passed through the gate port 8 even in a vertical posture as shown in FIG. 12(B) by setting the height of the gate port 8 greater than W and less than L. Furthermore, the apparatus can align cubic chip parts whose W, H, and L are all equal to each other.

Of course, the invention is not limited to the above embodiments. In the above embodiments, the chute groove 5 is shaped into an arc. The groove may also be straight and inclined. Accordingly, it is not necessary that the part-holding chamber be shaped like a drum. Where the arc-shaped chute groove is formed, the discharge passage is not required to be tangent to the chute groove. It is only necessary that each chip part flow smoothly into the discharge passage from the chute groove through the gate port.

In addition, the inclined guide surfaces permitting chip parts to slide toward the chute groove are not always required to be formed on both sides of the chute groove. Only one inclined surface suffices.

As can be understood from the description provided thus far, in the present invention, chip parts are caused to fall into a chute groove, aligned in a line, and passed through the gate port. In this way, the chip parts can be supplied in a given posture. Therefore, the part-holding chamber is made very simple in structure. Also, the apparatus rarely breaks down. Each chip part is made to slide along the chute groove by its own weight instead of restricting the chip parts one by one. Then, the chip parts are discharged from the gate port. Consequently, the chip parts are prevented from being overloaded. No problems will occur at all even if the discharge passage is clogged or overflows.

Even if the gate port is clogged with any chip part, the clogging can be removed by removing this chip part or correcting the posture. In consequence, the chip parts are less damaged. The part yield can be improved.

What is claimed is:

1. An apparatus useful for aligning parts, comprising:
   a part-holding chamber for accommodating a number of chip parts, said part-holding chamber having a bottom having an inner surface;
   at least one chute groove formed at least in the inner surface of the bottom of said part-holding chamber and acting to orient chip parts in a given direction and cause them to slide successively downward, said at least one chute groove having a depth;
   a gate port formed at the lower end of said at least one chute groove and permitting said chip parts sliding downward in a given posture along said chute groove to pass one by one;
   at least one discharge passage for aligning the passed chip parts in a line and discharging said parts; and
   a clogging-removing means movably positioned in said part-holding chamber, the clogging-removing means including first and second portions positioned to move adjacent to said gate port, the first and second portions having at least one leading edge, at least one trailing edge, and a gap separating the at least one leading edge and the at least one trailing edge, the length of the gap being greater than the at least one chute groove depth, the clogging-removing means for urging any chip part that is halted in said gate port in an abnormal posture toward a direction different from a direction in which the chip parts are discharged when chip parts are contained in said least one chute groove and when said clogging-removing means is moved in a direction away from the discharge passage.

2. The part-aligning apparatus of claim 1, further comprising a guide surface for sliding the chip parts into the chute groove on the inner surface of the part-holding chamber.

3. The part-aligning apparatus of claim 1, further comprising a rotary member rotatable around a horizontal axis, and wherein said clogging-removing means are claw portions provided on said rotary member adjacent to the gate port, said rotary member rotatable in the opposite direction from the chip part discharging direction.

4. The part-aligning apparatus of claim 3, wherein said rotary member is capable of being rotated intermittently.

5. The part-aligning apparatus of claim 3, wherein
   (A) said part-holding chamber is formed by a cylinder-like space whose central axis is a horizontal axis and including an inner surface, (B) said at least one chute groove is an arc-shaped groove provided on an inner surface of the cylinder-like space, (C) the at least one claw of said rotary member is rotated along the chute groove.

6. The part-aligning apparatus of claim 5, wherein (A) said part-holding chamber is composed of a stationary drum and a rotary drum having an inner surface, (B) said chute groove is an arc-shaped groove formed in the inner surface of said stationary drum, and (C) said clogging-removing means comprises at least one claw protruding from the inner surface of said rotary drum.

7. The part-aligning apparatus of claim 5, wherein said at least one discharge passage is substantially tangent to said arc-shaped chute groove, and wherein said gate port is formed at the junction of said at least one chute groove and said discharge passage.

8. The part-aligning apparatus of claim 1, wherein (A) said at least one chute groove is plural in number and formed in parallel in the inner surface of said part-holding chamber, (B) said gate port is formed at the lower end of each of said chute grooves, and (C) said at least one discharge passage is plural in number and is positioned and configured to align the chip parts, going out of said gate ports, in a line.

9. The part-aligning apparatus of claim 1, further comprising at least one chip part, and wherein (A) each of said at least one chip part has a length L greater than its height H and width W, (B) said gate port is identical in width to each of said at least one chute groove, and (C) the width of said gate port is greater than the height H and the width W and less than the length L of said at least one chip part.

10. A method of aligning chip parts, comprising the steps of:

causing said chip parts to slide into a chute groove through a gap between a leading edge and a trailing edge of a clogging-removing means, the length of the gap being greater than the depth of said chute groove;

passing said sliding chip parts through a gate port one by one;

aligning said passed chip parts in a row and delivering them; and urging any chip part in an abnormal posture in said gate port toward a direction different from a direction in which said chip parts are delivered, thereby removing clogging.

11. An apparatus useful for aligning parts, comprising:

a part-holding chamber for accommodating a number of chip parts, said part-holding chamber having a bottom having an inner surface;

at least one chute groove formed at least in the inner surface of the bottom of said part-holding chamber and acting to orient chip parts in a given direction and cause them to slide successively downward, said at least one chute groove having a depth;

a gate port formed at the lower end of said at least one chute groove and permitting said chip parts sliding downward in a given posture along said chute groove to pass one by one;

at least one discharge passage for aligning the passed chip parts in a line and discharging said parts; and a clogging-removing means movably positioned in said part-holding chamber, the clogging-removing means capable of turning any chip part that is in an abnormal posture while it is in said at least one chute groove toward a direction different from a direction in which the chip parts are discharged when chip parts are contained in said least one chute groove and when said clogging-removing means is moved in a direction away from the discharge passage; and an inclined surface formed on said inner surface of said part-holding chamber, the inclined surface extending below the clogging-removing means to orient chip parts in the at least one chute groove below the clogging-removing means.

\* \* \* \* \*